US006976822B2

(12) United States Patent
Woodruff et al.

(10) Patent No.: US 6,976,822 B2
(45) Date of Patent: Dec. 20, 2005

(54) END-EFFECTORS AND TRANSFER DEVICES FOR HANDLING MICROELECTRONIC WORKPIECES

(75) Inventors: Daniel J. Woodruff, Kalispell, MT (US); James J. Erickson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/620,326

(22) Filed: Jul. 14, 2003

(65) Prior Publication Data

US 2004/0037691 A1 Feb. 26, 2004

Related U.S. Application Data

(60) Provisional application No. 60/396,368, filed on Jul. 16, 2002.

(51) Int. Cl.[7] ............................................. B66C 1/00
(52) U.S. Cl. ................. 414/744.5; 294/1.1; 294/907; 414/808; 901/33
(58) Field of Search ...................... 414/744.5, 800, 414/806, 808; 294/1.1, 907; 901/33

(56) References Cited

U.S. PATENT DOCUMENTS

| 4,451,197 | A | 5/1984 | Lange |
| 4,639,028 | A | 1/1987 | Olson |
| 4,670,126 | A | 6/1987 | Messer et al. |
| 4,744,713 | A | 5/1988 | Hrovath |
| 4,770,590 | A | 9/1988 | Hugues et al. |
| 4,944,650 | A | 7/1990 | Matsumoto |
| 5,178,512 | A | 1/1993 | Skrobak |
| 5,442,416 | A | 8/1995 | Tateyama et al. |
| 5,460,478 | A | 10/1995 | Akimoto et al. |
| 5,639,206 | A | 6/1997 | Oda et al. |
| 5,711,646 | A | 1/1998 | Ueda et al. |
| 5,746,565 | A | 5/1998 | Tepolt |
| 5,759,006 | A | 6/1998 | Miyamoto et al. |
| 6,084,215 | A | 7/2000 | Furuya et al. |

(Continued)

FOREIGN PATENT DOCUMENTS

WO    WO 00/02808    1/2000

Primary Examiner—Donald W. Underwood
(74) Attorney, Agent, or Firm—Perkins Coie LLP

(57) ABSTRACT

Passive end-effectors for handling microelectronic workpieces having a perimeter edge circumscribing a first diameter. In one embodiment, a passive end-effector in accordance with the invention includes a body having a plurality of contact sites located along a circle corresponding to the first diameter of the workpiece. The body, for example, can be a paddle or a fork. The passive end-effector can also include a plurality of passive abutments that are carried by the body. The abutments are located along the circle, and the abutments are configured to support the workpiece in a plane spaced apart from the body. The abutments, for example, can each include an inclined surface that slopes downwardly toward a central region of the circle to support only the edge of the workpiece in a manner that suspends or otherwise spaces the workpiece in a plane that is spaced apart from the body. The passive end-effector can further include a sensor assembly that is carried by the body. The sensor includes an engagement member positioned at least partially within the circle, and the engagement member is configured to move generally transverse to the plane as the workpiece is loaded on and unloaded from the end-effector. The passive end-effector does not include an active member that exerts a force against the edge of the workpiece parallel to the plane of the workpiece.

44 Claims, 9 Drawing Sheets

U.S. PATENT DOCUMENTS

| | | | |
|---|---|---|---|
| 6,089,635 A * | 7/2000 | Lee ........................ | 294/907 X |
| 6,113,165 A | 9/2000 | Wen et al. | |
| 6,203,084 B1 * | 3/2001 | Kruk et al. ............. | 294/907 X |
| 6,206,441 B1 * | 3/2001 | Wen et al. .............. | 294/907 X |

* cited by examiner

END-EFFECTORS AND TRANSFER DEVICES FOR HANDLING MICROELECTRONIC WORKPIECES

CROSS-REFERENCE TO RELATED APPLICATIONS

This application claims benefit of U.S. Provisional Patent Application No. 60/396,368, filed Jul. 16, 2002.

TECHNICAL FIELD

The present invention relates to equipment for handling microelectronic workpieces.

BACKGROUND

Microelectronic devices are fabricated on and/or in microelectronic workpieces using several different apparatus ("tools"). Many such processing apparatus have a single processing station that performs one or more procedures on the workpieces. Other processing apparatus have a plurality of processing stations that perform a series of different procedures on individual workpieces or batches of workpieces. The workpieces are often handled by automatic handling equipment (i.e., robots) because microelectronic fabrication requires very precise positioning of the workpieces and/or conditions that are not suitable for human access (e.g., vacuum environments, high temperatures, chemicals, stringent clean standards, etc.).

An increasingly important category of processing apparatus are plating tools that plate metals and other materials onto workpieces. Existing plating tools use automatic handling equipment to handle the workpieces because the position, movement and cleanliness of the workpieces are important parameters for accurately plating materials onto the workpieces. The plating tools can be used to plate metals and other materials (e.g., ceramics or polymers) in the formation of contacts, interconnects and other components of microelectronic devices. For example, copper plating tools are used to form copper contacts and interconnects on semiconductor wafers, field emission displays, read/write heads and other types of microelectronic workpieces. A typical copper plating process involves depositing a copper seed layer onto the surface of the workpiece using chemical vapor deposition (CVD), physical vapor deposition (PVD), electroless plating processes, or other suitable methods. After forming the seed layer, copper is plated onto the workpiece by applying an appropriate electrical field between the seed layer and an anode in the presence of an electrochemical plating solution. The workpiece is then cleaned, etched and/or annealed in subsequent procedures before transferring the workpiece to another apparatus.

Single-wafer plating tools generally have a load/unload station, a number of plating chambers, a number of cleaning chambers, and a transfer mechanism for moving the microelectronic workpieces between the various chambers and the load/unload station. The transfer mechanism can be a rotary system having one or more robots that rotate about a fixed location in the plating tool. One existing rotary transfer mechanism is shown in U.S. Pat. No. 6,136,163 issued to Cheung, et al. Alternate transfer mechanisms include linear systems that have an elongated track and a plurality of individual robots that can move independently along the track. Each of the robots on a linear track can also include independently operable end-effectors. Existing linear track systems are shown in U.S. Pat. No. 5,571,325 issued to Ueyama, et al., PCT Publication No. WO 00/02808, and U.S. patent application Ser. Nos. 09/386,566; 09/386,590; 09/386,568; and 09/759,998, all of which are herein incorporated in their entirety by reference. Many rotary and linear transfer mechanisms have a plurality of individual robots that can each independently access most, if not all, of the processing stations within an individual tool to increase the flexibility and throughput of the plating tool.

These robots use end-effectors to carry the workpiece as it moves from one processing station to another. The nature and design of the end-effectors will depend, in part, on the nature of the workpiece being handled. For example, when the backside of the workpiece may directly contact the end-effector, a vacuum-based end-effector may be used. Such vacuum-based end-effectors typically have a plurality of vacuum outlets that draw the backside of the workpiece against a paddle or other type of end-effector. In other circumstances, however, the workpieces have components or materials on both the backside and the device side that cannot be contacted by the end-effector. For example, workpieces that have wafer-level packaging have components on both the device side and the backside. Such workpieces typically must be handled by edge-grip end-effectors, and the distance radially inward from the edge of a workpiece that such edge-grip end-effectors may contact is very limited. This makes it more difficult to securely grasp the workpiece during handling.

Several current edge-grip end-effectors use an active member that moves in the plane of the workpiece between a release position and a processing position to retain the workpiece on the end-effector. In the release position, the active member is disengaged from the workpiece in a position that is spaced apart from the workpiece to allow loading/unloading of the end-effector. In the processing position, the active member presses against the edge of the workpiece to drive the workpiece laterally against other edge-grip members in a manner that secures the workpiece to the end-effector. The active member can be a plunger with a groove that receives the edge of the workpiece, and the other edge-grip members can be projections that also have a groove to receive other portions of the edge of the workpiece. In operation, the active member moves radially outward to the release position to receive a workpiece and then moves radially inward to the processing position to securely grip the edge of the workpiece in the grooves of the edge-grip members and the active member.

One concern of active edge-grip end-effectors is that they have several moving components that increase the complexity of manufacturing and servicing. For example, the mechanical or electrical systems that drive the active member can fail, which causes downtime or damage to workpieces. Additionally, contaminants can build up in small gaps and recesses in plunger-type active members. Therefore, active edge-grip end-effectors may not be suitable for use in certain types of integrated plating tools.

It would also be advantageous to confirm that a workpiece is properly positioned on an end-effector before the end-effector moves the workpiece. International Publication No. WO 00/02808 suggests using light reflected off the workpiece to determine the presence of a workpiece. A lack of reflected light indicates that no workpiece is present. While such a system does indicate whether a workpiece is in the proper vicinity, it does not ensure that the workpiece is properly seated on the end-effector. Thus, semiconductor fabricators also need better systems for determining whether a workpiece is in the correct position on edge-grip end-effectors. The proper positioning of the workpiece on edge-grip end-effectors is particularly important because the edge-grip members must also space the workpiece apart from the paddle.

SUMMARY

The present invention is directed toward various passive end-effectors for handling microelectronic workpieces and methods of handling microelectronic workpieces. Certain embodiments of the invention provide passive end-effectors having detectors capable of monitoring whether a workpiece is properly seated on the end-effector and, if so desired, generate an error signal. The passive end-effectors do not include an active member that presses against the edge of the workpiece in a direction parallel to the plane of the workpiece. As a result, the passive end-effectors reduce the number of moving parts to eliminate or reduce failures and contamination sites. Additionally, because the passive end-effectors have a detector that monitors whether a workpiece is properly seated on the end-effectors, they are expected to significantly reduce the likelihood that a workpiece will be damaged inadvertently.

The passive end-effectors are particularly useful for handling microelectronic workpieces having a perimeter edge circumscribing a first diameter. In one embodiment, a passive end-effector in accordance with the invention includes a body having a plurality of contact sites located along a circle corresponding to the first diameter of the workpiece. The body, for example, can be a paddle or a fork. The passive end-effector can also include a plurality of passive abutments that are carried by the body. The abutments are located along the circle, and the abutments are configured to support the workpiece in a plane spaced apart from the body. The abutments, for example, can each include an inclined surface that slopes downwardly toward a central region of the circle to support only the edge of the workpiece in a manner that suspends or otherwise spaces the workpiece in a plane that is spaced apart from the body. The passive end-effector can further include a sensor assembly that is carried by the body. The sensor includes an engagement member positioned at least partially within the circle, and the engagement member is configured to move generally transverse to the plane as the workpiece is loaded on and unloaded from the end-effector. The passive end-effector does not include an active member that exerts a force against the edge of the workpiece parallel to the plane of the workpiece.

A particular embodiment of a passive end-effector in accordance with the invention includes a body having at least a first contact site, a second contact site and a third contact site along the circle corresponding to the first diameter of the workpiece. The first and second contact sites are on a semicircle of the primary circle, and a third contact site is on an opposing semicircle of the primary circle. The passive abutments include at least a first abutment at the first contact site, a second abutment at the second contact site, and a third abutment at the third contact site. Each abutment includes an inclined surface that slopes downwardly toward a center region of the circle and a rim that projects upwardly from the upper end of the inclined surface. The inclined surfaces support the edge of the workpiece to hold the workpiece in a plane spaced apart from the body, and the rims of the abutments limit the lateral motion of the workpiece relative to the body. The sensor can be a pin with a contact region that is at least partially within the circle and moves generally transverse to the plane of the workpiece under the influence of the workpiece. The pin can be a lever that pivots in a manner to move the contact region transversely to the workpiece plane. Alternatively, the pin can be a rod that is biased upwardly and moves axially under the weight of the workpiece.

The sensor can also include a detector that detects the relative location of the contact region of the pin. The detector can be an optical system that indicates when the contact region of the pin is in a raised position or a lowered position. In other embodiments, the detector can be electrical contacts or mechanical systems that detect the relative location of the contact region. In one embodiment, when the detector indicates that the contact region of the pin is in the raised position, the workpiece is not loaded onto the body in a manner that is appropriate for transferring the workpiece to processing stations. Conversely, when the detector indicates that the contact region of the pin is in the lowered position, the workpiece is then known to be properly seated on the workpiece.

It will be appreciated that the function of the raised and lowered positions can be inverted so that the raised position in certain embodiments may indicate that the wafer is properly seated on the body and the lowered position can indicate that the wafer is unloaded from the body.

DETAILED DESCRIPTION

The following description discloses the details and features of several embodiments of end-effectors for handling microelectronic workpieces, and methods for using such devices. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the art to make and use the disclosed embodiments. Several of the details and advantages described below, however, may not be necessary to practice certain embodiments of the invention. Additionally, the invention can also include additional embodiments that are within the scope of the claims, but are not described in detail with respect to FIGS. 1–6.

The operation and features of the end-effectors for handling microelectronic workpieces are best understood in light of the environment and equipment in which they can be used. As such, several embodiments of processing apparatus and transfer devices with which the end-effectors can be used will be described with reference to FIGS. 1–2B. The details and features of several embodiments of end-effectors will then be described with reference to FIGS. 3–6.

Figure 1:
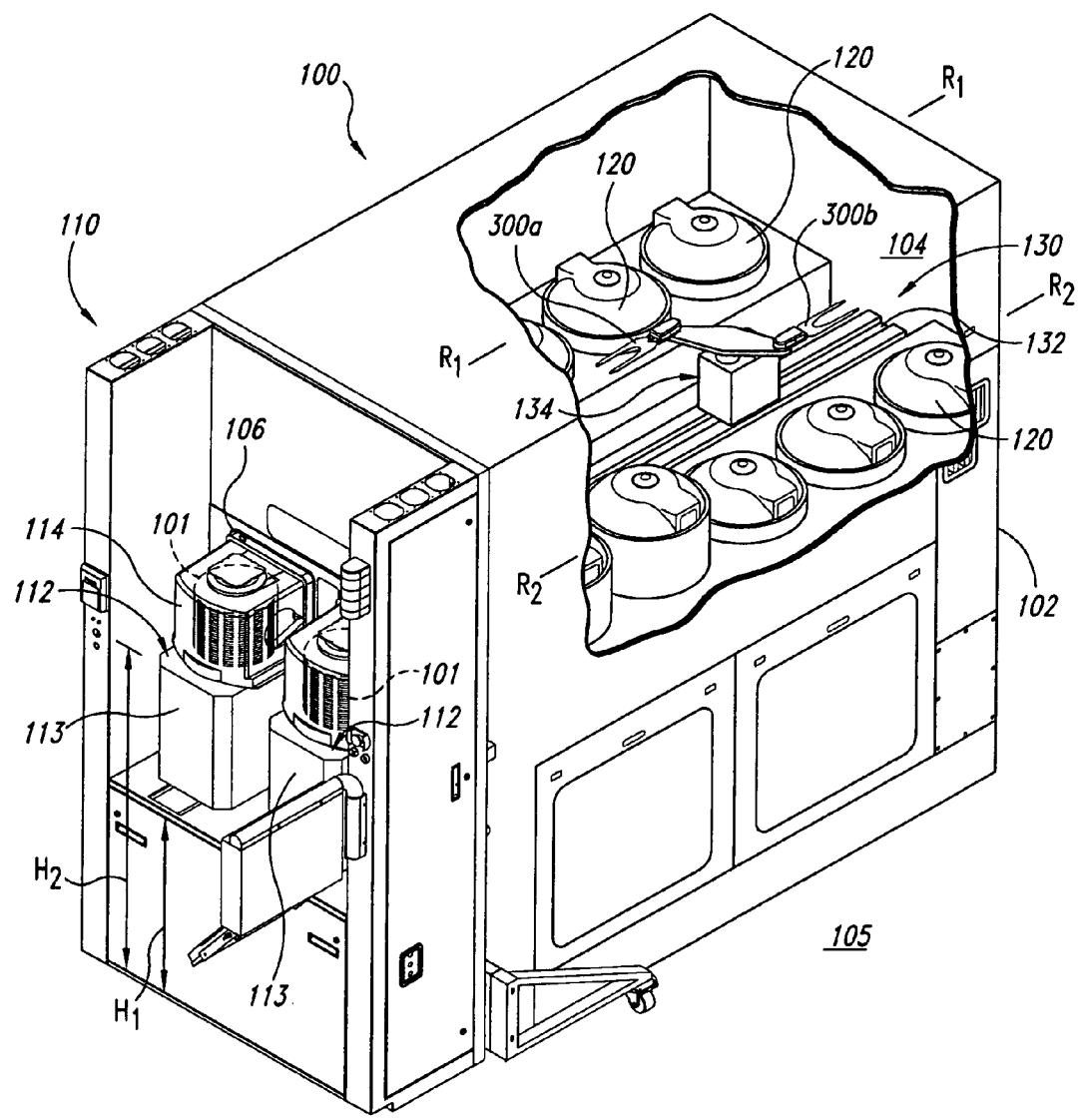
FIG. 1 is an isometric view of a processing apparatus for processing microelectronic workpieces including a transfer device for handling the workpieces in accordance with an embodiment of the invention. A portion of the processing apparatus is shown in a cut-away illustration.

A. Selected Embodiments of Microelectronic Workpiece Processing Apparatus for Use with Automatic Workpiece Transfer Devices FIG. 1 is an isometric view of a processing apparatus 100 having a transfer device 130 in accordance with an embodiment of the invention for manipulating a plurality of microelectronic workpieces 101. A portion of the processing apparatus 100 is shown in a cut-away view to illustrate selected internal components. In one aspect of this embodiment, the processing apparatus 100 can include a cabinet 102 having an interior region 104 defining an enclosure that is at least partially isolated from an exterior region 105. The cabinet 102 can also include a plurality of apertures 106 through which the workpieces 101 can ingress and egress between the interior region 104 and a load/unload station 110.

The load/unload station 110 can have two container supports 112 that are each housed in a protective shroud 113. The container supports 112 are configured to position workpiece containers 114 relative to the apertures 106 in the cabinet 102. The workpiece containers 114 can each house a plurality of microelectronic workpieces 101 in a "mini" clean environment for carrying a plurality of workpieces through other environments that are not at clean room standards. Each of the workpiece containers 114 is accessible from the interior region 104 of the cabinet 102 through the apertures 106.

The processing apparatus 100 can also include a plurality of processing stations 120 and the transfer device 130 in the interior region 104 of the cabinet 102. The processing apparatus, for example, can be a plating tool, and the processing stations 120 can be single-wafer chambers for electroplating, electroless plating, annealing, cleaning, etching, and/or metrology analysis. Suitable processing stations 120 for use in the processing apparatus 100 are disclosed in U.S. Pat. Nos. 6,228,232 and 6,080,691, and in U.S. application Ser. Nos. 09/385,784; 09/386,803; 09/386,610; 09/386,197; 09/501,002; 09/733,608; 09/804,696; and 09/804,697, all of which are herein incorporated in their entirety by reference. The processing stations 120 are not limited to plating devices, and thus the processing apparatus 100 can be another type of tool.

The transfer device 130 moves the microelectronic workpieces 101 between the workpiece containers 114 and the processing stations 120. In the embodiment shown in FIG. 1, the transfer device 130 includes a linear track 132 extending in a lengthwise direction of the interior region 104 between the processing stations 120. Also in the particular embodiment shown in FIG. 1, a first set of processing stations 120 is arranged along a first row $R_1$-$R_1$ and a second set of processing stations 120 is arranged along a second row $R_2$-$R_2$. The linear track 132 extends between the first and second rows of processing stations 120. The transfer device 130 can further include a robot unit 134 carried by the track 132.

Figure 2A:
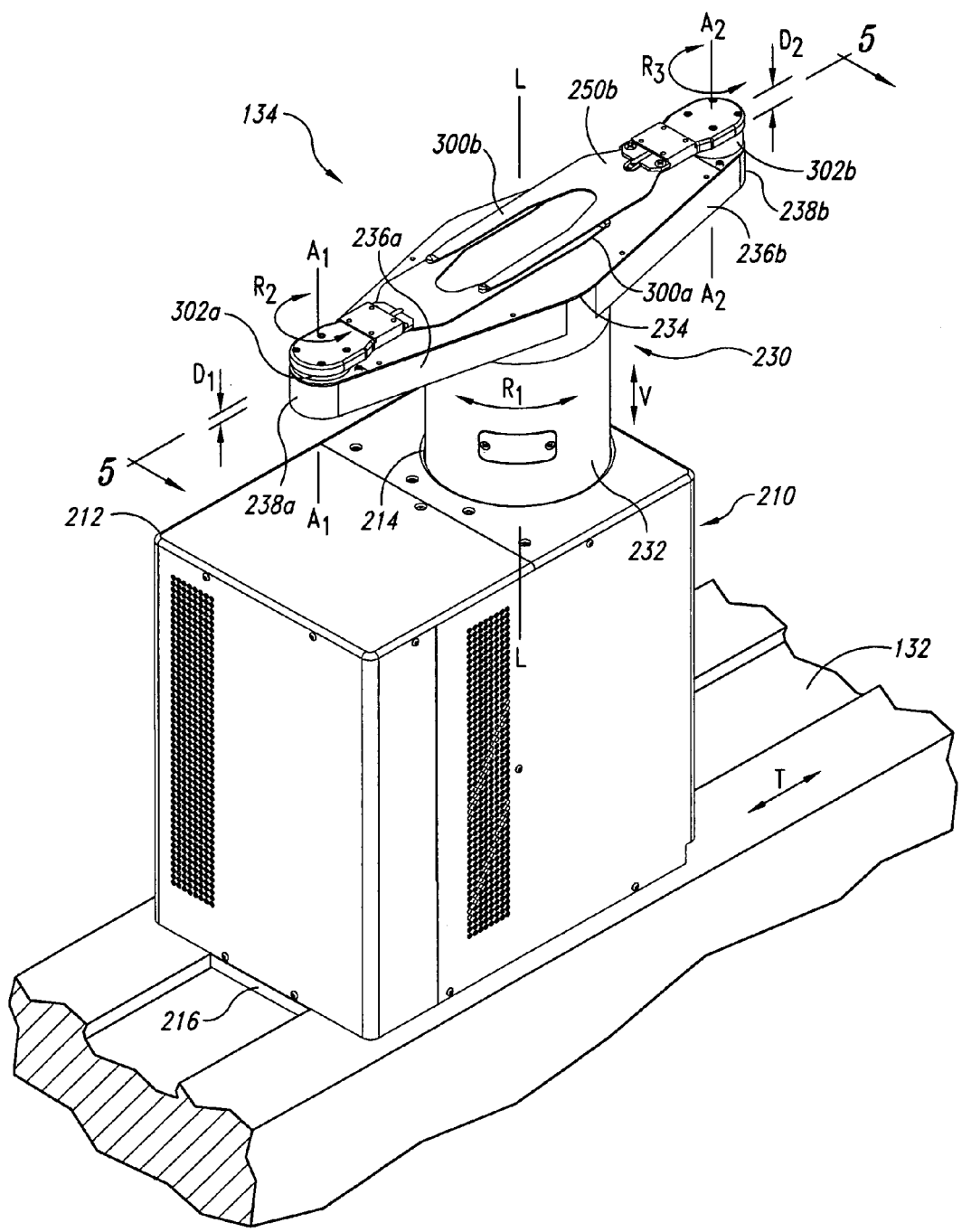
FIGS. 2A–2B are isometric views of transfer devices for handling microelectronic workpieces in accordance with embodiments of the invention.

B. Embodiments of Transfer Devices for Handling Microelectronic Workpieces in Processing Machines FIG. 2A illustrates an embodiment of the robot unit 134 in greater detail. The robot unit 134 can include a transport unit 210, an arm assembly 230 carried by the transport unit 210, and first and second end-effectors 300 (identified individually by reference numbers 300a and 300b) carried by the arm assembly 230. The transport unit 210 can include a shroud or housing 212 having a plurality of panels attached to an internal frame (not shown in FIG. 2A). An opening 214 in a top panel of the housing 212 receives a portion of the arm assembly 230. It will be appreciated that the transport unit 210 and the housing 212 can have many different configurations depending upon the particular environment in which the robot unit 134 is used. The transport unit 210, for example, can be a base that can be stationary, rotary, or move in a non-linear manner. The transport unit 210 can also include a guide member configured to move laterally along the track 132. The particular embodiment of the transport unit 210 shown in FIG. 2A includes a guide member defined by a base plate 216 that slidably couples the robot unit 134 to the track 132. The robot unit 134 can accordingly translate along the track 132 (arrow T) to position the robot unit 134 adjacent to a desired processing station 120 (FIG. 1).

The arm assembly 230 can include a waist member 232 that is coupled to a lift assembly (not shown in FIG. 2A). The arm assembly 230 can also include an arm 234 having a medial section 235, a first extension 236a projecting from one side of the medial section 235, and a second extension 236b extending from another side of the medial section 235. The first and second extensions 236a–b of the arm 234 can be diametrically opposed to one another as shown in FIG. 2A, or they can extend at a desired angle to each other. In one embodiment, the first and second extensions 236a and 236b are integral with another, but in alternate embodiments the first and second extensions 236a and 236b can be individual components that are fixed to each other.

The arm assembly 230 can move along a lift path L-L to change the elevation of the arm 234 for positioning the end-effectors 300 at desired elevations. The lift path L-L generally extends transverse to the track 132, which as used herein includes any oblique or perpendicular arrangement. The arm assembly 230 can also rotate (arrow $R_1$) about the lift path L-L to position a distal end 238a of the first extension 236a and/or a distal end 238b of the second extension 236b proximate to a desired workpiece container 114 or processing station 120. The first and second extensions 236a–b generally rotate about the lift path L-L as a single unit because they are integral or fixed with each other. The motion of the first and second extensions 236a–b are accordingly dependent upon each other in this embodiment. In alternate embodiments, the arm 234 can have extensions that are not fixed to each other and can move independently from each other, or the arm assembly 230 may be at a fixed elevation.

The end-effectors 300 are rotatably carried by the arm 234. In one embodiment, the first end-effector 300a is rotatably coupled to the first distal end 238a to rotate about a first rotation axis $A_1$-$A_1$ (arrow $R_2$). The second end-effector 300b can be rotatably coupled to the second distal end 238b of the arm 234 to rotate about a second rotation axis $A_2$-$A_2$ (arrow $R_3$). The first and second rotation axes $A_1$-$A_1$ and $A_2$-$A_2$ can extend generally parallel to the lift path L-L, but in alternate embodiments these axes can extend transverse to the lift path L-L. The rotational motion of (a) the arm 234 about the lift path L-L, (b) the first end-effector 300a about the first rotation axis $A_1$-$A_1$, and (c) the second end-effector 300b about the second rotation axis $A_2$-$A_2$ can be coordinated so that the first and second end-effectors 300a and 300b can each be positioned adjacent to any of the workpiece containers 114 and processing stations 120 on either side of the cabinet 102 (FIG. 1).

The first end-effector 300a can be spaced apart from the arm 234 by a first distance $D_1$, and the second end-effector 300b can be spaced apart from the arm 234 by a second distance $D_2$. In the embodiment shown in FIG. 2A, the distance D, is less than the distance $D_2$ such that the first end-effector 300a is at a different elevation than the second end-effector 300b. The first end-effector 300a accordingly moves through a first plane as it rotates about the first rotation axis $A_1$-$A_1$, and the second end-effector 300b moves through a second plane as it rotates about the second rotation axis $A_2$-$A_2$. The first and second planes are generally parallel and fixedly spaced apart from each other so that the end-effectors 300a–b cannot interfere with each other. The first and second planes, however, can have other arrangements (i.e., nonparallel) so long as they do not intersect in a region over the arm 234. The first and second end-effectors 300a and 300b can be fixed at the particular elevations relative to the arm 234 using spacers or other types of devices. For example, the first end-effector 300a can be spaced apart from the arm 234 by a first spacer 302a, and the second end-effector 300b can be spaced apart from the arm 234 by a second spacer 302b. The first and second spacers 302a–b can have different thicknesses to space the end-effectors 300 apart from the arm 234 by the desired distances.

Figure 2B:
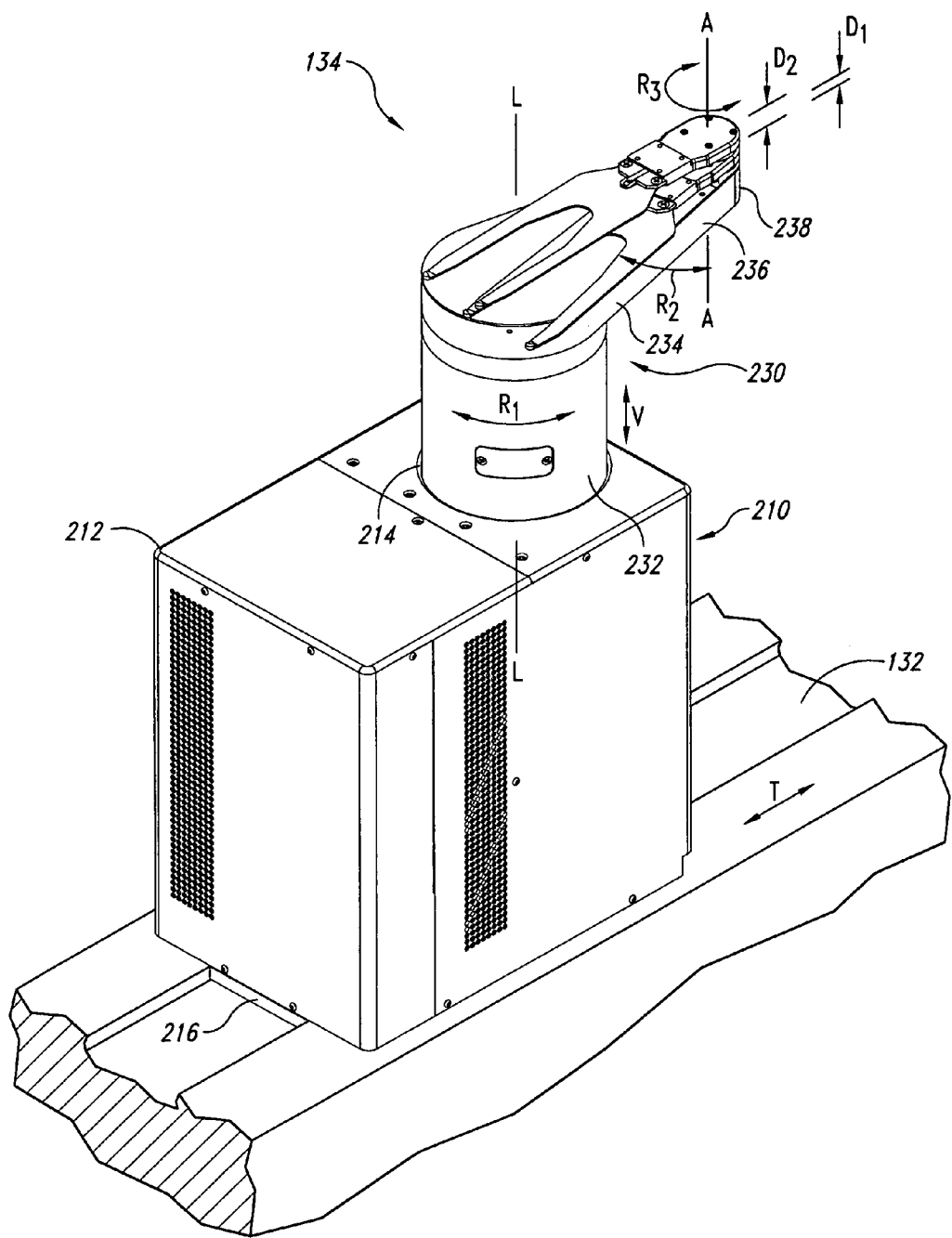

The first and second end-effectors 300a–b and the arm 234 can have different configurations than the configuration shown in FIG. 2A. For example, as shown in FIG. 2B, the arm 234 can have only a single extension 236 projecting from the waist member 232 and both of the end-effectors 300a–b can be carried by the "single-extension" arm such that the first and second end-effectors 300a–b are fixed at different elevations relative to the arm 234. The end-effectors 300a–b, for example, can be coupled to the end 238 of the arm and rotate about a common rotation axis A-A.

The robot unit 134a can include a transport unit 210, an arm assembly 230 carried by the transport unit 210, and an arm 234 having a single extension 236 as described above. This embodiment differs from the other embodiments in that it has a single end-effector 300 attached to the distal end 238 of the arm 234.

C. Embodiments of Passive End-Effectors for Handling Microelectronic Workpieces

The following end-effectors disclosed in FIGS. 3–6 are passive edge-grip end-effectors that support the edge of a workpiece in a manner that spaces the underside of the workpiece apart from the paddle or fork portion of the end-effector. The passive edge-grip end-effectors do not have active elements that exert a force in a direction parallel to the plane of the workpiece for driving an opposite edge of the workpiece laterally against passive edge-grip elements. For example, the passive edge-grip end-effectors do not include spring loaded or pneumatically operated members, such as plungers or pistons, that press against the workpiece to drive it laterally in the plane of the workpiece. The passive edge-grip end-effectors set forth below accordingly elimi-nate several moving parts and reduce sites where contaminants can collect compared to end-effectors that include active elements.

Figure 3:
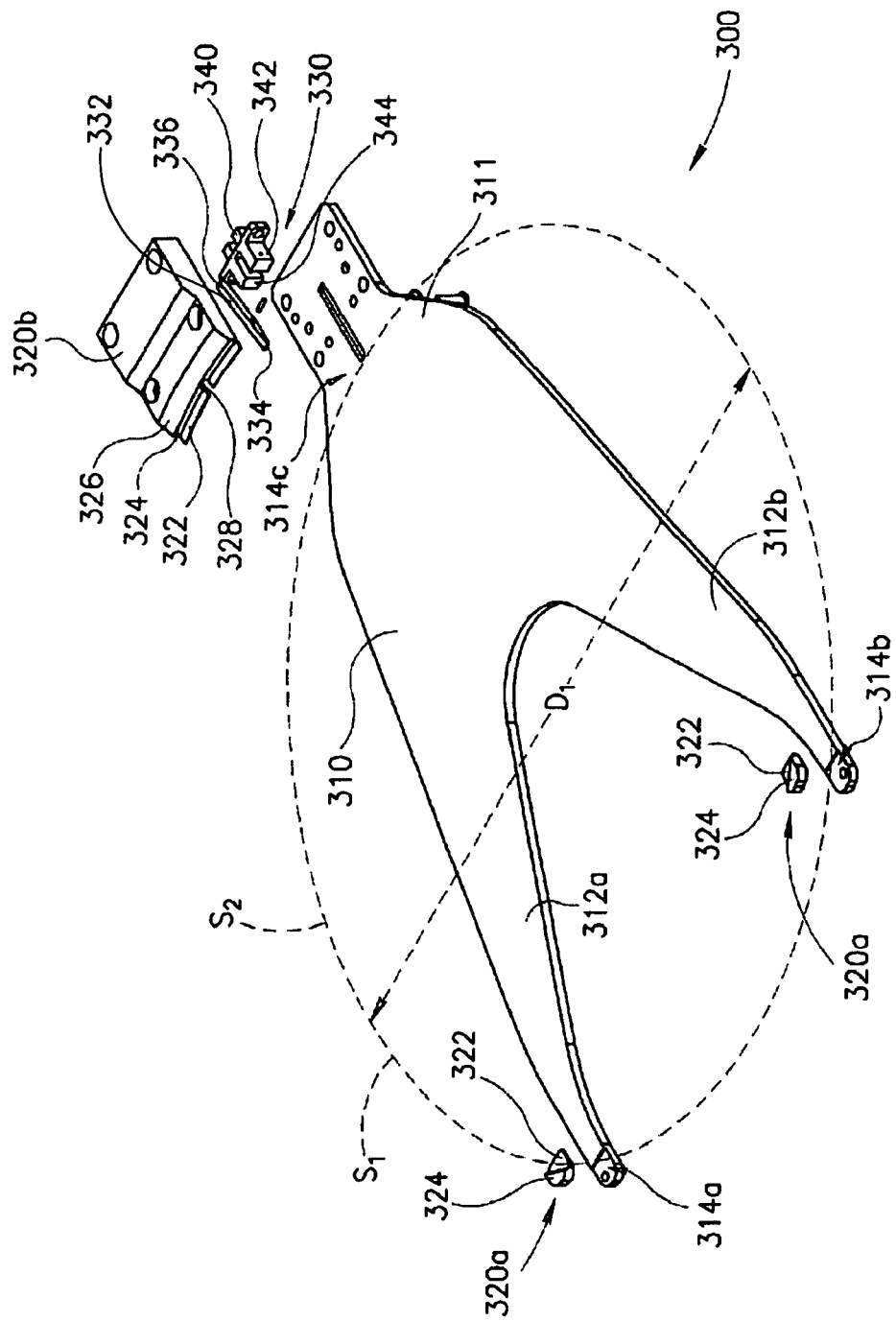
FIG. 3 is an exploded isometric view illustrating the components of an end-effector for handling microelectronic workpieces in accordance with an embodiment of the invention.

FIG. 3 is an exploded isometric view of an end-effector 300 for use with the robot 134 (FIGS. 1–2B) in accordance with one embodiment of the invention. The end-effector 300 can include a body 310, a plurality of passive abutments or retainers 320 (identified by reference numbers 320a and 320b), and a sensor assembly 330. The abutments 320 and the sensor assembly 330 are carried by the body. As explained in more detail below, the end-effector 300 is configured to hold and carry a workpiece having a perimeter edge circumscribing a diameter defining circle $D_1$.

The body 310 can be a fork, paddle or other configuration. The body 310 is typically a planar element that is relatively lightweight to reduce the force that the robot 134 (FIG. 2A) needs to provide for moving the end-effector 300. In the embodiment shown in FIG. 3, the body 310 is a fork having a base 311, a first prong 312a projecting from one portion of the base 311, and a second fork 312b extending from another portion of the base 311. The body 310 has a plurality of contact sites 314a–c that are arranged along the circle $D_1$ corresponding to the first diameter of a workpiece. The contact sites can include at least a first contact site 314a, a second contact site 314b, and a third contact site 314c. The first and second contact sites 314a–b are on a semicircle $S_1$ of the circle $D_1$, and the third contact site 314c is on an opposing semicircle $S_2$ of the circle $D_1$. The 3-point contact configuration of the end-effector 300 shown in FIG. 3 provides a base over which a workpiece can be held during transport. It will be appreciated that the body 310 can be a paddle or have other configurations with more or fewer contact sites in other applications.

The retainers 320 are positioned at the contact sites 314. More specifically, a first type of retainer 320a is positioned at the first contact site 314a and the second contact site 314b, and a second type of retainer 320b is positioned at the third contact site 314c. Each retainer 320 includes an inclined surface 322 and a rim 324 that projects upwardly from the upper end of the inclined surface 322. The inclined surfaces 322 slope downwardly toward a central region of the end-effector and lie along the circle $D_1$. The inclined surfaces 322 can thus support an edge of the workpiece such that the workpiece is held in a workpiece plane spaced apart from the body 310. The rims 324 circumscribe a circle that has a diameter slightly larger than the diameter $D_1$ of the workpiece to limit lateral movement of a workpiece within the circle $D_1$. It will be appreciated that the retainers 320a and 320b can have other configurations that restrict lateral movement of the workpiece to within a region that is approximately the size of the circle $D_1$ and support the workpiece in the manner that spaces the workpiece apart from the body 310.

The retainer 320b also includes a tapered surface 326 that guides a workpiece onto the inclined surfaces 322, and a gap 328 in the inclined surface 322 of the retainer 320b. As explained in more detail below, the retainer 320b shown in the embodiment of FIG. 3 also provides a housing for the sensor assembly 330b.

The sensor assembly 330 includes a pin 332 having a first end 334 and a second end 336. In the embodiment shown in FIG. 3, the first end 334 of the pin 332 is positioned at least partially within the gap 328 of the retainer 320b and within the circle $D_1$ so that a perimeter portion of the workpiece will engage the first end 334 of the pin 332.

The weight of the workpiece moves the first end 334 of the pin 332 downwardly and transversely relative to the plane of the workpiece. The first end 334 of the pin 332 accordingly defines a contact region positioned at least partially within the circle $D_1$.

The sensor assembly 330 also includes a detector 340 that can be an optical system, an electrical system, or a mechanical system. In the embodiment shown in FIG. 3, the detector 340 is an optical system having an emitter 342 and a receiver 344. The second end 336 of the pin 332 is received in a slot between the emitter 342 and the receiver 344 to move relative to the detector 340 when the workpiece (not shown in FIG. 3) engages the first end 334 of the pin 332. The detector 340 determines the position of the second end 336 of the pin 332 to indicate whether the workpiece is properly positioned on the end-effector 300.

Figure 4:
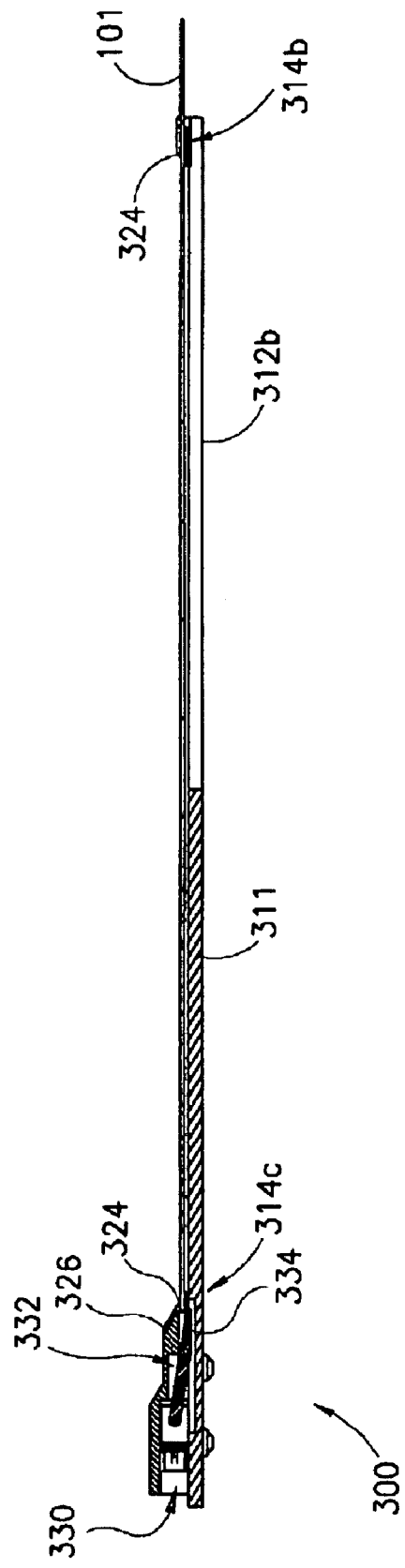
FIG. 4 is a cross-sectional view of an assembled end-effector in accordance with the embodiment shown in FIG. 3.

FIG. 4 is a cross-sectional view illustrating an embodiment of the end-effector 300 shown in FIG. 3. In this embodiment, a workpiece 101 has been properly seated onto the end-effector 300 such that a perimeter portion of the workpiece is supported by the inclined surfaces 322 (FIG. 3) of the retainers 314a–c (retainer 314a not shown in FIG. 4). The outermost portion of the workpiece 100 is contained within the rims 324 of the retainers 314, and a portion of the workpiece 101 engages the first end 334 of the pin 332.

Figure 5A:
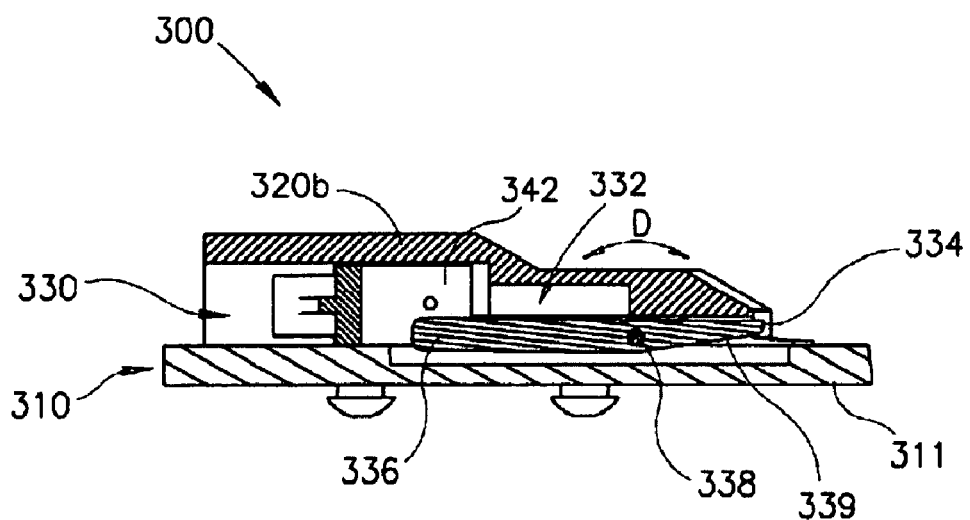
FIGS. 5A and 5B are cross-sectional views illustrating a portion of the end-effector illustrated in FIG. 3.
Figure 5B:
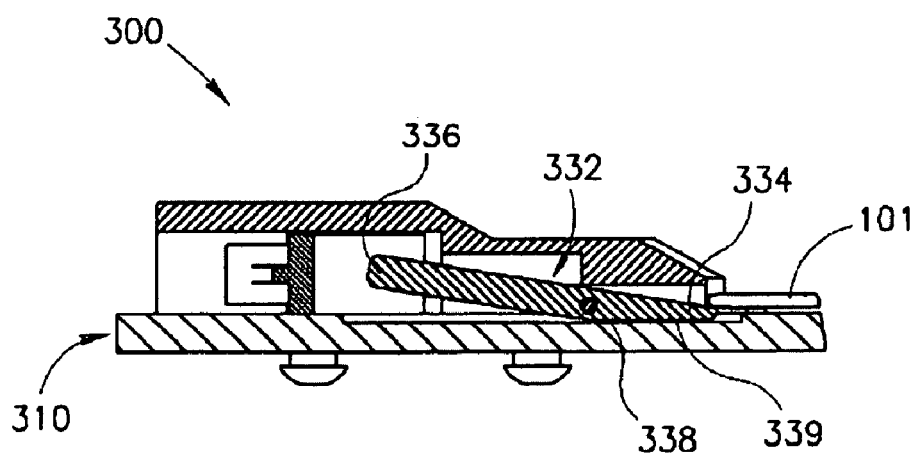

FIGS. 5A and 5B are partial cross-sectional views that illustrate the operation of the sensor assembly 330 in greater detail. Referring to FIG. 5A, the pin 332 is a lever that pivots about a pivotal connection 338. The pivotal connection 338 is located relative to the pin 332 so that more weight is at the second end 336 than the first end 334. As a result, the first end 334 of the pin 332 is positioned in a first position or raised position in which it is elevated. The pin 332 also includes a beveled section 339 or cutout portion at the first end 334 to allow the pin 332 to rotate downwardly.

FIG. 5A also illustrates the location of the emitter 342 of the sensor assembly 330. It will be appreciated that the receiver 344 (shown in FIG. 3) can be located directly across from the emitter 342. When a workpiece is not loaded on the end-effector 300 or is not seated properly on the end-effector 300, the first end 334 of the pin 332 is in a raised position such that the second end 336 of the pin 332 does not block the line of sight between the emitter 342 and the receiver 344. The sensor assembly 330 can accordingly indicate that a workpiece is not seated on the end-effector 300.

FIG. 5B illustrates the sensor assembly 330 when a workpiece 101 is properly seated on the end-effector 300. The edge of the workpiece 101 engages the first end 334 of the pin 332. The weight of the workpiece 101 rotates the pin 332 so that the first end 334 moves transversely with respect to a workpiece plane defined by the workpiece 101. The pin 332 may rotate until the beveled section 339 of the pin 332 contacts the body 310. In this position, the second end 336 of the pin 332 blocks the line of sight between the emitter 342 and the receiver 344. The detector can accordingly indicate that the workpiece 101 is seated properly on the end-effector 300.

Figure 6:
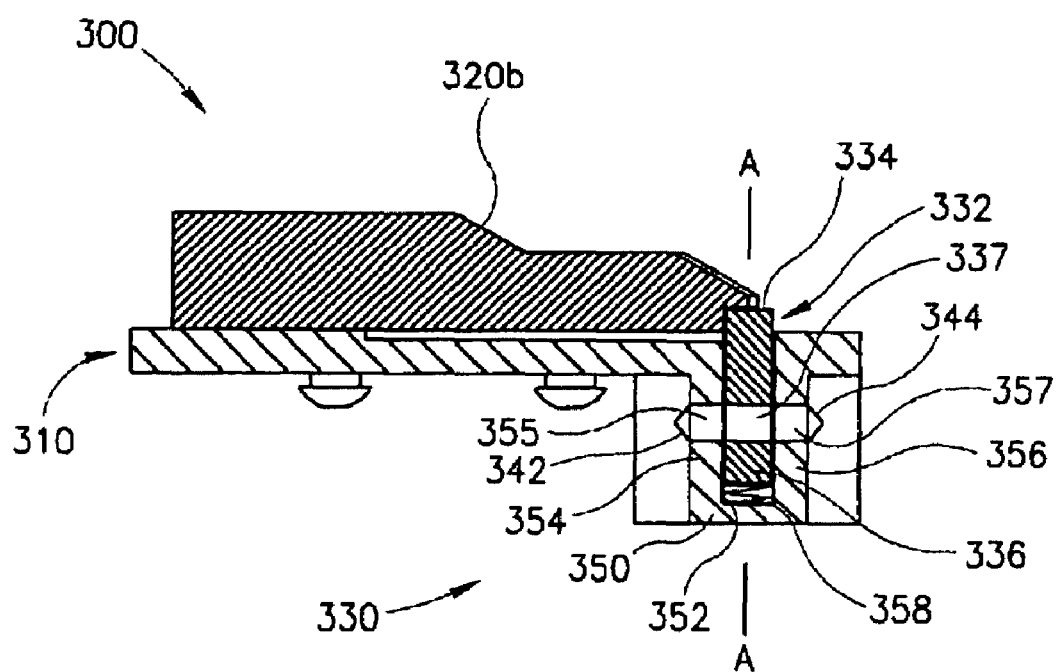
FIG. 6 is a cross-sectional view illustrating a portion of an end-effector in accordance with another embodiment of the invention.

FIG. 6 is a cross-sectional view of another embodiment of the end-effector 300 having a different embodiment of the sensor assembly 330. In this embodiment, the sensor assembly 330 includes a pin 332 that moves transversely to the plane of the workpiece (not shown in FIG. 6) along an axis A-A. The sensor assembly 330 is mounted to a housing 350 on the bottom side of the body 310. The housing 350 includes a bore 352 that receives the pin 332, a first wall 354 with a first window 355, and a second wall 356 with a second window 357. The pin 332 is received in the bore 352 so that the first end 334 is positioned to engage a perimeter edge of the workpiece, and the second end 336 is supported by a driving member 358 at the bottom of the bore 352. The driving member 358 urges the pin 332 upwardly until the first end 334 contacts a portion of the retainer 320b. The pin 332 also includes a window 337 that can be aligned with the windows 355 and 357 of the housing 350 in a first position or misaligned with the window in a second position. The sensor assembly 330 in the embodiment shown in FIG. 6 also includes an emitter 342 aligned with the window 355 and a receiver 344 aligned with the window 357.

In operation, the driving member 358 positions the pin 332 in the first position in which the windows 337, 355 and 357 are aligned with one another so that the receiver 344 can receive light or other types of radiation from the emitter 342. When a workpiece is properly seated on the end-effector 300, the workpiece drives the pin 332 downwardly into the bore 352 so that the window 337 of the pin 332 is not aligned with the windows 355 and 357. The pin 332 thus blocks the line of site between the emitter 342 and the receiver 344 when the workpiece is properly seated on the end-effector. The sensor assembly 330 can accordingly indicate whether the workpiece is properly seated in the end-effector 300 by noting the intensity of the radiation received by the receiver 344.

Figure 7A:
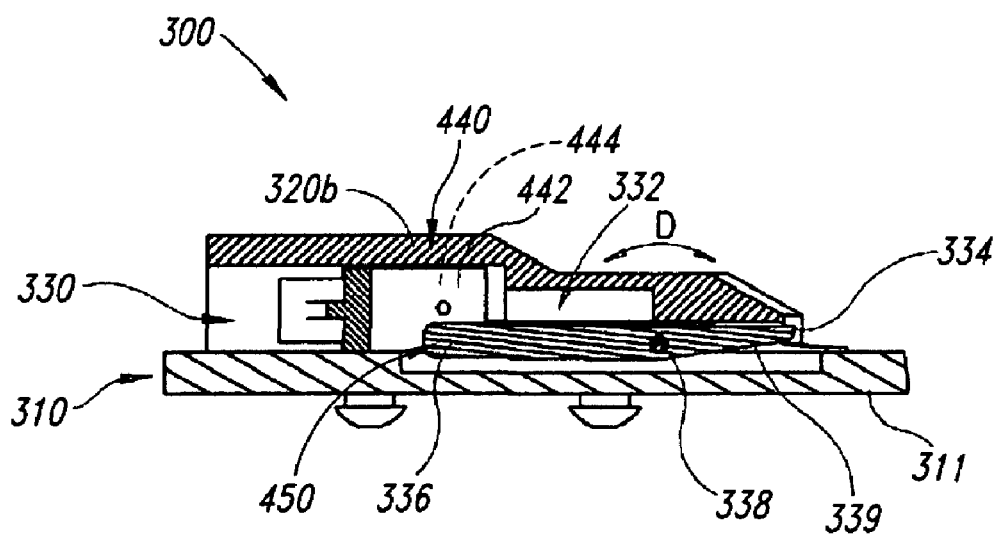
FIGS. 7A and 7B are cross-sectional views illustrating a portion of an end-effector in accordance with another embodiment of the invention.
Figure 7B:
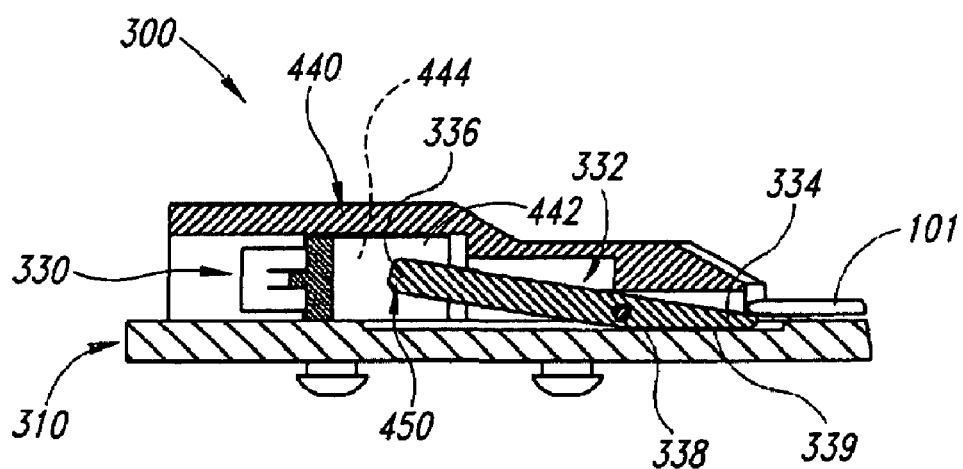
Figure 8:
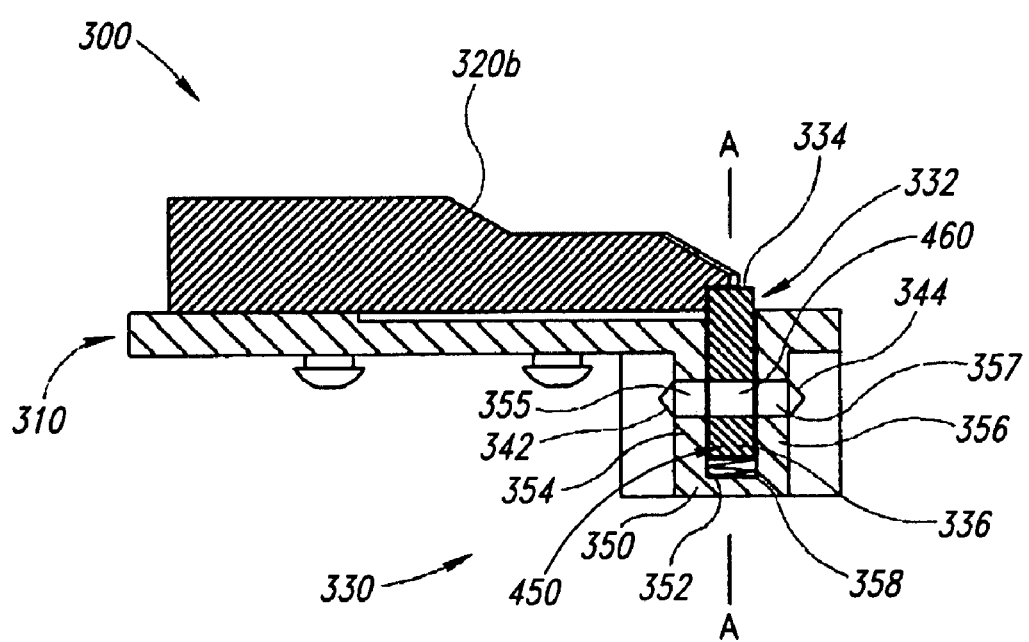
FIG. 8 is a cross-sectional view illustrating a portion of an end-effector in accordance with still another embodiment of the invention.

It will be appreciated that the sensor assembly 330 in either the embodiment shown in FIGS. 5A and 5B or the embodiment shown in FIG. 6 can be electrical contacts or other types of mechanical sensors. Referring to FIGS. 7A and 7B, for example, instead of using an emitter and receiver as described above, a detector 440 can include first and second contacts 442 and 444 for an electrical circuit that is opened or closed according to the position of the pin 332. The first and second contacts 442 and 444 for the electrical circuit can be located at the emitter 342 and receiver 344 sites (shown in FIG. 3), respectively. The pin 332 can accordingly include a conductive portion 450 at the second end 336. The conductive portion 450 of the pin 332 can be configured to engage the first and second contact sites 442 and 444 when the pin 332 is driven downward by a workpiece. Referring to FIG. 8, a sensor assembly 330 in accordance with still another embodiment includes a conductive section 460 at the location of the window 337 in the embodiment shown in FIG. 6. The conductive portion 450 of the pin 332 can be configured to engage the conductive section 460 when the pin 332 is driven downward by a workpiece. Therefore, it will be appreciated that other embodiments of sensor assemblies can be used in conjunction with passive edge-grip end-effectors in accordance with other embodiments of the invention.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A passive end-effector for handling a microelectronic workpiece having a perimeter edge circumscribing a first diameter, comprising:

a body having a plurality of contact sites located along a circle corresponding to the first diameter of the workpiece, the contact sites including at least a first contact site, a second contact site and a third contact site, wherein the first and second contact sites are on a semicircle of the circle and the third contact site is on an opposing semicircle of the circle;

a plurality of passive retainers carried by the body including at least a first retainer at the first contact site, a second retainer at the second contact site and a third retainer at the third contact site, each retainer including an inclined surface that slopes downwardly toward a central region of the circle to support an edge of the workpiece, wherein the inclined surfaces are arranged to hold the workpiece in a plane spaced apart from the body; and a sensor carried by the body, the sensor having a moveable pin with a contact region at least partially within the circle, wherein the pin moves generally transverse to the plane as the workpiece is loaded on and unloaded from the end-effector.

2. The passive end-effector of claim 1, wherein:

the sensor assembly further comprises an optical system having an emitter and a receiver aligned with the emitter across a gap; and the pin comprises a lever that pivots about a connection, the lever having a first end defining the contact region and a second end in the gap between the emitter and the receiver.

3. The passive end-effector of claim 1, wherein:

the body carries a housing having a bore extending transverse to the circle and a driving member in the bore;

the sensor assembly further comprises an optical system having an emitter on one side of the bore and a receiver aligned with the emitter across the bore; and the pin comprises a rod that moves axially in the bore, the rod having a first end defining the contact region extending out of the bore, a second end in the bore between the emitter and the receiver, and a window that is aligned with the emitter and receiver when the rod is in a first position.

4. The passive end-effector of claim 1, wherein:

the sensor assembly further comprises an electrical system having a first contact and a second contact spaced apart from the first contact across a gap; and the pin comprises a lever that pivots about a connection, the lever having a first end defining the contact region and a second end in the gap between the first and second contacts of the electrical system.

5. The passive end-effector of claim 1, wherein:

the body carries a housing having a bore extending transverse to the circle and a driving member in the bore;

the sensor assembly further comprises an electrical system having a first contact and a second contact spaced apart from the first contact across the bore; and the pin comprises a rod that moves axially in the bore, the rod having a first end defining the contact region extending out of the bore, a second end in the bore between the emitter and the receiver, and an electrical conductor that is aligned with the first and second contacts when the rod is in a first position.

6. A passive end-effector for handling a microelectronic workpiece having a perimeter edge circumscribing a first diameter, comprising:

a body having a plurality of contact sites located along a circle corresponding to the first diameter of the workpiece;

a plurality of passive retainers carried by the body, each retainer including an inclined surface that slopes downwardly toward a central region of the circle to support the workpiece in a plane spaced apart from the body;

a sensor carried by the body, the sensor having a moveable pin with a contact region at least partially within the circle, wherein the pin moves generally transverse to the plane; and wherein the passive end-effector does not include an active member that moves between a release position in which it is engaged with the workpiece and a processing position in which it presses the workpiece against the retainers.

7. The passive end-effector of claim 6, wherein:

the sensor assembly further comprises an optical system having an emitter and a receiver aligned with the emitter across a gap; and the pin comprises a lever that pivots about a connection, the lever having a first end defining the contact region and a second end in the gap between the emitter and the receiver.

8. The passive end-effector of claim 6, wherein:

the body carries a housing having a bore extending transverse to the circle and a driving member in the bore;

the sensor assembly further comprises an optical system having an emitter on one side of the bore and a receiver aligned with the emitter across the bore; and the pin comprises a rod that moves axially in the bore, the rod having a first end defining the contact region extending out of the bore, a second end in the bore between the emitter and the receiver, and a window that is aligned with the emitter and receiver when the rod is in a first position.

9. The passive end-effector of claim 6, wherein:

the sensor assembly further comprises an electrical system having a first contact and a second contact spaced apart from the first contact across a gap; and the pin comprises a lever that pivots about a connection, the lever having a first end defining the contact region and a second end in the gap between the first and second contacts of the electrical system.

10. The passive end-effector of claim 6, wherein:

the body carries a housing having a bore extending transverse to the circle and a driving member in the bore;

the sensor assembly further comprises an electrical system having a first contact and a second contact spaced apart from the first contact across the bore; and the pin comprises a rod that moves axially in the bore, the rod having a first end defining the contact region extending out of the bore, a second end in the bore between the emitter and the receiver, and an electrical conductor that is aligned with the first and second contacts when the rod is in a first position.

11. A passive end-effector for handling a microelectronic workpiece having a perimeter edge circumscribing a first diameter, comprising:

a body having a plurality of contact sites located along a circle corresponding to the first diameter of the workpiece;

a plurality of passive retainers carried by the body, the retainers being located along the circle, and the retainers being configured to support the workpiece in a plane spaced apart from the body;

a sensor carried by the body, the sensor having an engagement member positioned at least partially within the circle, wherein the engagement moves generally transverse to the plane; and wherein the passive end-effector does not include an active member that exerts a force against the edge of the workpiece parallel to the plane to press the workpiece against the retainers.

12. The passive end-effector of claim 11, wherein:

the sensor assembly further comprises an optical system having an emitter and a receiver aligned with the emitter across a gap; and the engagement member comprises a lever that pivots about a connection, the lever having a first end defining the contact region and a second end in the gap between the emitter and the receiver.

13. The passive end-effector of claim 11, wherein:

the body carries a housing having a bore extending transverse to the circle and a driving member in the bore;

the sensor assembly further comprises an optical system having an emitter on one side of the bore and a receiver aligned with the emitter across the bore; and the engagement member comprises a rod that moves axially in the bore, the rod having a first end defining the contact region extending out of the bore, a second end in the bore between the emitter and the receiver, and a window that is aligned with the emitter and receiver when the rod is in a first position.

14. The passive end-effector of claim 11, wherein:

the sensor assembly further comprises an electrical system having a first contact and a second contact spaced apart from the first contact across a gap; and the engagement member comprises a lever that pivots about a connection, the lever having a first end defining the contact region and a second end in the gap between the first and second contacts of the electrical system.

15. The passive end-effector of claim 11, wherein:

the body carries a housing having a bore extending transverse to the circle and a driving member in the bore;

the sensor assembly further comprises an electrical system having a first contact and a second contact spaced apart from the first contact across the bore; and the engagement member comprises a rod that moves axially in the bore, the rod having a first end defining the contact region extending out of the bore, a second end in the bore between the emitter and the receiver, and an electrical conductor that is aligned with the first and second contacts when the rod is in a first position.

16. A passive end-effector for handling a microelectronic workpiece having a perimeter edge circumscribing a first diameter, comprising:

a body having a plurality of contact sites located along a circle corresponding to the first diameter of the workpiece;

a plurality of passive retainers carried by the body, the retainers being located along the circle, and the retainers being configured to support the workpiece in a plane spaced apart from the body;

a sensor carried by the body, the sensor having a lever with a contact region at least partially in the circle, a pivot joint coupled to the lever to allow the contact region to move generally transverse to the plane between a raised position and a lowered position; and wherein the passive end-effector does not include an active member that exerts a force against the edge of the workpiece parallel to the plane to press the workpiece against the retainers.

17. A passive end-effector for handling a microelectronic workpiece having a perimeter edge circumscribing a first diameter, comprising:

a body having a plurality of contact sites located along a circle corresponding to the first diameter of the workpiece;

a support means for passively supporting the workpiece in a plane spaced apart from the body that does not exert a force against the workpiece parallel to the plane;

a sensing means for sensing proper positioning of the workpiece on the passive support means, the sensing means being carried by the body, and the sensing means having a member positioned at least partially within the circle that moves generally transverse to the plane; and wherein the passive end-effector does not include an active member that exerts a force against the edge of the workpiece parallel to the plane to press the workpiece against the retainers.

18. A transfer device for handling a microelectronic workpiece having a perimeter edge circumscribing a first diameter, comprising:

a transport unit configured to move along a transport path;

an arm carried by the transport unit; and an end-effector carried by the arm, the end-effector comprising a body having a plurality of contact sites located along a circle corresponding to the first diameter of the workpiece, the contact sites including at least a first contact site, a second contact site and a third contact site, wherein the first and second contact sites are on a semicircle of the circle and the third contact site is on an opposing semicircle of the circle;

a plurality of passive retainers carried by the body including at least a first retainer at the first contact site, a second retainer at the second contact site and a third retainer at the third contact site, each retainer including an inclined surface that slopes downwardly toward a central region of the circle to support an edge of the workpiece, wherein the inclined surfaces are arranged to hold the workpiece in a plane spaced apart from the body; and a sensor carried by the body, the sensor having a moveable pin with a contact region at least partially within the circle, wherein the pin moves generally transverse to the plane as the workpiece is loaded on or unloaded from the end-effector.

19. The transfer device of claim 18, wherein:

the sensor assembly further comprises an optical system having an emitter and a receiver aligned with the emitter across a gap; and the pin comprises a lever that pivots about a connection, the lever having a first end defining the contact region and a second end in the gap between the emitter and the receiver.

20. The transfer device of claim 18, wherein:

the body carries a housing having a bore extending transverse to the circle and a driving member in the bore;

the sensor assembly further comprises an optical system having an emitter on one side of the bore and a receiver aligned with the emitter across the bore; and the pin comprises a rod that moves axially in the bore, the rod having a first end defining the contact region extending out of the bore, a second end in the bore between the emitter and the receiver, and a window that is aligned with the emitter and receiver when the rod is in a first position.

21. The transfer device of claim 18, wherein:
the sensor assembly further comprises an electrical system having a first contact and a second contact spaced apart from the first contact across a gap; and
the pin comprises a lever that pivots about a connection, the lever having a first end defining the contact region and a second end in the gap between the first and second contacts of the electrical system.

22. The transfer device of claim 18, wherein:
the body carries a housing having a bore extending transverse to the circle and a driving member in the bore;
the sensor assembly further comprises an electrical system having a first contact and a second contact spaced apart from the first contact across the bore; and
the pin comprises a rod that moves axially in the bore, the rod having a first end defining the contact region extending out of the bore, a second end in the bore between the emitter and the receiver, and an electrical conductor that is aligned with the first and second contacts when the rod is in a first position.

23. A transfer device for handling a microelectronic workpiece having a perimeter edge circumscribing a first diameter, comprising:
a transport unit configured to move along a transport path;
an arm carried by the transport unit; and
an end-effector carried by the arm, the end-effector comprising
a body having a plurality of contact sites located along a circle corresponding to the first diameter of the workpiece;
a plurality of passive retainers carried by the body, each retainer including an inclined surface that slopes downwardly toward a central region of the circle to support the workpiece in a plane spaced apart from the body;
a sensor carried by the body, the sensor having a moveable pin with a contact region at least partially within the circle, wherein the pin moves generally transverse to the plane; and
wherein the end-effector does not include an active member that exerts a force against the edge of the workpiece parallel to the plane to press the workpiece against the retainers.

24. The transfer device of claim 23, wherein:
the sensor assembly further comprises an optical system having an emitter and a receiver aligned with the emitter across a gap; and
the pin comprises a lever that pivots about a connection, the lever having a first end defining the contact region and a second end in the gap between the emitter and the receiver.

25. The transfer device of claim 23 wherein:
the body carries a housing having a bore extending transverse to the circle and a driving member in the bore;
the sensor assembly further comprises an optical system having an emitter on one side of the bore and a receiver aligned with the emitter across the bore; and
the pin comprises a rod that moves axially in the bore, the rod having a first end defining the contact region extending out of the bore, a second end in the bore between the emitter and the receiver, and a window that is aligned with the emitter and receiver when the rod is in a first position.

26. The transfer device of claim 23, wherein:
the sensor assembly further comprises an electrical system having a first contact and a second contact spaced apart from the first contact across a gap; and
the pin comprises a lever that pivots about a connection, the lever having a first end defining the contact region and a second end in the gap between the first and second contacts of the electrical system.

27. The transfer device of claim 23, wherein:
the body carries a housing having a bore extending transverse to the circle and a driving member in the bore;
the sensor assembly further comprises an electrical system having a first contact and a second contact spaced apart from the first contact across the bore; and
the pin comprises a rod that moves axially in the bore, the rod having a first end defining the contact region extending out of the bore, a second end in the bore between the emitter and the receiver, and an electrical conductor that is aligned with the first and second contacts when the rod is in a first position.

28. A transfer device for handling a microelectronic workpiece having a perimeter edge circumscribing a first diameter, comprising:
a transport unit configured to move along a transport path;
an arm carried by the transport unit; and
an end-effector carried by the arm, the end-effector comprising
a body having a plurality of contact sites located along a circle corresponding to the first diameter of the workpiece;
a plurality of passive retainers carried by the body, the retainers being located along the circle, and the retainers being configured to support the workpiece in a plane spaced apart from the body;
a sensor carried by the body, the sensor having an engagement member positioned at least partially within the circle, wherein the engagement moves generally transverse to the plane; and
wherein the end-effector does not include an active member that exerts a force against the edge of the workpiece parallel to the plane to press the workpiece against the retainers.

29. The transfer device of claim 28, wherein:
the sensor assembly further comprises an optical system having an emitter and a receiver aligned with the emitter across a gap; and
the engagement member comprises a lever that pivots about a connection, the lever having a first end defining the contact region and a second end in the gap between the emitter and the receiver.

30. The transfer device of claim 28, wherein:
the body carries a housing having a bore extending transverse to the circle and a driving member in the bore;
the sensor assembly further comprises an optical system having an emitter on one side of the bore and a receiver aligned with the emitter across the bore; and
the engagement member comprises a rod that moves axially in the bore, the rod having a first end defining the contact region extending out of the bore, a second end in the bore between the emitter and the receiver, and a window that is aligned with the emitter and receiver when the rod is in a first position.

31. The transfer device of claim 28, wherein:
the sensor assembly further comprises an electrical system having a first contact and a second contact spaced apart from the first contact across a gap; and
the engagement member comprises a lever that pivots about a connection, the lever having a first end defining the contact region and a second end in the gap between the first and second contacts of the electrical system.

32. The transfer device of claim 28, wherein:
the body carries a housing having a bore extending transverse to the circle and a driving member in the bore;
the sensor assembly further comprises an electrical system having a first contact and a second contact spaced apart from the first contact across the bore; and
the engagement member comprises a rod that moves axially in the bore, the rod having a first end defining the contact region extending out of the bore, a second end in the bore between the emitter and the receiver, and an electrical conductor that is aligned with the first and second contacts when the rod is in a first position.

33. A transfer device for handling a microelectronic workpiece having a perimeter edge circumscribing a first diameter, comprising:
a transport unit configured to move along a transport path;
an arm carried by the transport unit; and
an end-effector carried by the arm, the end-effector comprising
a body having a plurality of contact sites located along a circle corresponding to the first diameter of the workpiece;
a plurality of passive retainers carried by the body, the retainers being located along the circle, and the retainers being configured to support the workpiece in a plane spaced apart from the body;
a sensor carried by the body, the sensor having a lever with a contact region at least partially in the circle, a pivot joint coupled to the lever to allow the contact region to move generally transverse to the plane between a raised position and a lowered position; and
wherein the end-effector does not include an active member that exerts a force against the edge of the workpiece parallel to the plane to press the workpiece against the retainers.

34. A transfer device for handling a microelectronic workpiece having a perimeter edge circumscribing a first diameter, comprising:
a transport unit configured to move along a transport path;
an arm carried by the transport unit; and
an end-effector carried by the arm, the end-effector comprising
a body having a plurality of contact sites located along a circle corresponding to the first diameter of the workpiece;
a support means for passively supporting the workpiece in a plane spaced apart from the body that does not exert a force against the workpiece parallel to the plane;
a sensing means for sensing proper positioning of the workpiece on the passive support means, the sensing means being carried by the body, and the sensing means having a member positioned at least partially within the circle that moves generally transverse to the plane; and
wherein the end-effector does not include an active member that exerts a force against the edge of the workpiece parallel to the plane to press the workpiece against the retainers.

35. A method of handling a microelectronic workpiece having a perimeter edge circumscribing a first diameter, comprising:
supporting a perimeter edge of the workpiece to hold the workpiece in a plane without exerting a force against the workpiece in a direction parallel to the plane; and
detecting whether a moveable pin located at least partially within the first diameter of the workpiece is displaced by the workpiece in a direction transverse to the plane.

36. The method of claim 35:
further comprising supporting the workpiece with a passive end-effector having a body with a plurality of passive retainers located at contact sites along a circle corresponding to the first diameter of the workpiece and a sensor assembly carried by the body, the sensor assembly including the pin and an optical system having an emitter and a receiver aligned with the emitter across a gap, wherein the pin comprises a lever having a first end defining a contact region in the circle and a second end in the gap between the emitter and the receiver; and
wherein detecting whether the moveable pin is displaced by the workpiece comprises sensing a location of the second end of the lever relative to the receiver.

37. The method of claim 36 where sensing the relative location comprises indicating when the second end of the lever is between the emitter and the receiver.

38. The method of claim 35:
further comprising supporting the workpiece with a passive end-effector having a body with a plurality of passive retainers located at contact sites along a circle corresponding to the first diameter of the workpiece and a sensor assembly carried by the body, the sensor assembly including the pin and an optical system having an emitter and a receiver aligned with the emitter across a gap, wherein the pin comprises a rod that moves axially within a bore and has a first end, a second end, and a window between the first and second ends; and
wherein detecting whether the moveable pin is displaced by the workpiece comprises sensing a location of the window relative to the receiver.

39. A method of handling a microelectronic workpiece having a perimeter edge circumscribing a first diameter, comprising:
contacting a perimeter edge of the workpiece with a plurality of passive retainers to hold the workpiece in a plane without exerting a force against the workpiece in a direction parallel to the plane;
engaging a pin of a sensor with the workpiece, the pin being moveable transversely relative to the plane under the influence of the weight of the workpiece; and
detecting whether the pin was displaced by the workpiece in a direction transverse to the plane.

40. The method of claim 39:
further comprising supporting the workpiece with a passive end-effector having a body with a plurality of passive retainers located at contact sites along a circle corresponding to the first diameter of the workpiece and a sensor assembly carried by the body, the sensor assembly including the pin and an optical system having an emitter and a receiver aligned with the emitter across a gap, wherein the pin comprises a lever having a first end defining a contact region in the circle and a second end in the gap between the emitter and the receiver; and wherein detecting whether the pin was displaced by the workpiece comprises sensing a location of the second end of the lever relative to the receiver.

41. The method of claim 40 where sensing the relative location comprises indicating when the second end of the lever is between the emitter and the receiver.

42. The method of claim 39:

further comprising supporting the workpiece with a passive end-effector having a body with a plurality of passive retainers located at contact sites along a circle corresponding to the first diameter of the workpiece and a sensor assembly carried by the body, the sensor assembly including the pin and an optical system having an emitter and a receiver aligned with the emitter across a gap, wherein the pin comprises a rod that moves axially within a bore and has a first end, a second end, and a window between the first and second ends; and wherein detecting whether the pin was displaced by the workpiece comprises sensing a location of the window relative to the receiver.

43. A method of processing a microelectronic workpiece having a perimeter edge circumscribing a first diameter, comprising:

loading the workpiece into a transfer device by supporting a perimeter edge of the workpiece to hold the workpiece in a plane without exerting a force against the workpiece in a direction parallel to the plane, and detecting whether a moveable pin located at least partially within the first diameter of the workpiece is displaced by the workpiece in a direction transverse to the plane;

moving the workpiece to a processing station;

unloading the workpiece in the processing station; and performing a process on the workpiece.

44. A method of handling a microelectronic workpiece having a perimeter edge circumscribing a first diameter, comprising:

loading the workpiece into a transfer device by contacting a perimeter edge of the workpiece with a plurality of passive retainers to hold the workpiece in a plane without exerting a force against the workpiece in a direction parallel to the plane, engaging a pin of a sensor with the workpiece, the pin being moveable transversely relative to the plane under the influence of the weight of the workpiece, and detecting whether the pin was displaced by the workpiece in a direction transverse to the plane;

moving the workpiece to a processing station;

unloading the workpiece in the processing station; and performing a process on the workpiece.

\* \* \* \* \*